United States Patent
You et al.

(10) Patent No.: US 12,464,821 B2
(45) Date of Patent: Nov. 4, 2025

(54) INTEGRATED CIRCUIT INCLUDING INTEGRATED STANDARD CELL STRUCTURE

(71) Applicant: Samsung Electronics Co., Ltd., Suwon-si (KR)

(72) Inventors: Hyeon Gyu You, Suwon-si (KR); In Gyum Kim, Suwon-si (KR); Gi Young Yang, Suwon-si (KR); Ji Su Yu, Suwon-si (KR); Jin Young Lim, Suwon-si (KR); Hak Chul Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/617,569

(22) Filed: Mar. 26, 2024

(65) Prior Publication Data

US 2024/0243134 A1    Jul. 18, 2024

Related U.S. Application Data

(63) Continuation of application No. 17/561,887, filed on Dec. 24, 2021, now Pat. No. 11,973,081, which is a
(Continued)

(30) Foreign Application Priority Data

Nov. 4, 2019    (KR) .................. 10-2019-0139527

(51) Int. Cl.
    H10D 84/90    (2025.01)
    H10D 89/10    (2025.01)

(52) U.S. Cl.
    CPC .......... H10D 84/907 (2025.01); H10D 89/10 (2025.01); H10D 84/912 (2025.01);
(Continued)

(58) Field of Classification Search
    None
    See application file for complete search history.

(56) References Cited

U.S. PATENT DOCUMENTS 6,785,877 B1    8/2004    Kozai
7,129,562 B1   10/2006    Gheewala et al.
(Continued)

FOREIGN PATENT DOCUMENTS

KR    1020160105263 A    9/2016
KR    1020170023358 A    3/2017
(Continued)

*Primary Examiner* — Steven M Page
(74) *Attorney, Agent, or Firm* — Muir Patent Law, PLLC

(57) ABSTRACT

An integrated circuit includes a first standard cell including a first first-type transistor, a first second-type transistor, a third second-type transistor, and a third first-type transistor, a second standard cell including a second first-type transistor, a second second-type transistor, a fourth second-type transistor and a fourth first-type transistor, a plurality of wiring layers which are disposed on the first and second standard cells and includes a first wiring layer, a second wiring layer, and a third wiring layer sequentially stacked. A source contact of the first first-type transistor and a source contact of the second first-type transistor are electrically connected through a first power rail of the plurality of wiring layers, and a source contact of the third first-type transistor and a source contact of the fourth first-type transistor are electrically connected through a second power rail of the plurality of wiring layers.

12 Claims, 17 Drawing Sheets

Related U.S. Application Data continuation of application No. 16/888,677, filed on May 30, 2020, now Pat. No. 11,244,961.

(52) U.S. Cl.
CPC ......... *H10D 84/921* (2025.01); *H10D 84/966* (2025.01); *H10D 84/975* (2025.01); *H10D 84/981* (2025.01); *H10D 84/987* (2025.01)

(56) References Cited

U.S. PATENT DOCUMENTS

| | | |
|---|---|---|
| 8,582,340 B2 | 11/2013 | Chong et al. |
| 9,496,174 B2 | 11/2016 | Liu et al. |
| 9,817,941 B2 | 11/2017 | Salowe et al. |
| 10,014,320 B2 | 7/2018 | Kanno et al. |
| 10,593,701 B2 | 3/2020 | Seo et al. |
| 2018/0254287 A1* | 9/2018 | Seo .................. H10D 89/10 |
| 2019/0164993 A1* | 5/2019 | Shimbo ............. H10D 62/10 |
| 2019/0355749 A1 | 11/2019 | Do et al. |
| 2021/0057411 A1 | 2/2021 | Kim et al. |

FOREIGN PATENT DOCUMENTS

| | | |
|---|---|---|
| KR | 1020170063354 A | 6/2017 |
| KR | 1020180101698 A | 9/2018 |
| KR | 1020180132492 A | 12/2018 |

\* cited by examiner

INTEGRATED CIRCUIT INCLUDING INTEGRATED STANDARD CELL STRUCTURE

This application is a Continuation of U.S. patent application Ser. No. 17/561,887, filed on Dec. 24, 2021, now Allowed, which is a Continuation of U.S. patent application Ser. No. 16/888,677, filed on May 30, 2020, U.S. Pat. No. 11,244,961, which claims priority under 35 U.S.C. § 119 to Korean Patent Application No. 10-2019-0139527 filed on Nov. 4, 2019 in the Korean Intellectual Property Office, the disclosure of each of which is incorporated herein by reference in its entirety.

BACKGROUND

1. Field of the Invention

The present invention relates to an integrated circuit including an integrated standard cell structure.

2. Description of the Related Art

Integrated circuits may be designed on the basis of standard cells. Specifically, a layout of an integrated circuit may be generated, by arranging standard cells in accordance with data defining the integrated circuit and by routing the arranged standard cells. Such standard cells may be pre-designed and stored in a cell library.

As a semiconductor fabricating process is miniaturized, the size of patterns in the standard cell may decrease, and the size of the standard cell may also decrease.

SUMMARY

Aspects of the present invention provide an integrated circuit capable of enhancing the integration degree of a layout and improving the performance and reliability of a designed semiconductor device, by routing a source end of a transistor with a plurality of wiring layers.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, an integrated circuit includes a first standard cell including a first first-type transistor, a first second-type transistor, a third second-type transistor, and a third first-type transistor, a second standard cell including a second first-type transistor, a second second-type transistor, a fourth second-type transistor and a fourth first-type transistor, a plurality of wiring layers which are disposed on the first and second standard cells and includes a first wiring layer, a second wiring layer, and a third wiring layer sequentially stacked, A source contact of the first first-type transistor and a source contact of the second first-type transistor are electrically connected through a first power rail of the plurality of wiring layers, a source contact of the third first-type transistor and a source contact of the fourth first-type transistor are electrically connected through a second power rail of the plurality of wiring layers, and drain contacts of the first through fourth first-type transistors and first through fourth second-type transistors of the first and second standard cells are all electrically connected through the first wiring layer, the second wiring layer, and the third wiring layer.

According to another embodiment of the present disclosure, an integrated circuit includes a first standard cell which includes a first p-type transistor and a first n-type transistor, a second standard cell disposed to be adjacent to the first standard cell and including a second p-type transistor and a second n-type transistor and a plurality of wiring layers which are disposed on the first and second standard cells and include a first wiring layer, a second wiring layer, and a third wiring layer sequentially stacked, A source contact of the first p-type transistor and a source contact of the second p-type transistor are electrically connected through a power rail of the plurality of wiring layers, a drain contact of the first p-type transistor and a drain contact of the first n-type transistor are connected to each other, a drain contact of the second p-type transistor and a drain contact of the second n-type transistor are connected to each other, the drain contacts of the transistors of the first and second standard cells are electrically connected through wiring lines of the first through third wiring layers, wiring lines of the second wiring layer and the drain contacts of the transistors of the first and second standard cells are disposed to be parallel to each other in a first direction, and the wiring lines of the first and third wiring layers are disposed to extend in a second direction perpendicular to the first direction.

According to other embodiment of the present disclosure, an integrated circuit includes a first standard cell including a first first-type transistor and a first second-type transistor, a second standard cell which is disposed to be adjacent to the first standard cell in a first direction and includes a second first-type transistor and a second second-type transistor, and a plurality of wiring layers which are formed on the first and second standard cells, and includes a first wiring layer, a second wiring layer, and a third wiring layer sequentially stacked. A source contact of the first first-type transistor and a source contact of the second first-type transistor are disposed independently of each other, a power rail of the plurality of wiring layers is electrically connected such that a source contact of the first first-type transistor and a source contact of the second first-type transistor are shared, and applies a power supply voltage, first and third wiring lines of the first wiring layer are electrically connected to drain contacts of the transistors of the first and second standard cells, and extend in the first direction, a second wiring line of the first wiring layer is electrically connected to gate contacts of the transistors of the first and second standard cells, and extends in the first direction, first and third wiring lines of the second wiring layer are electrically connected to the first and third wiring lines of the first wiring layer, and extend in a second direction perpendicular to the first direction, and a second wiring line of the second wiring layer are electrically connected to the second wiring line of the first wiring layer, and extends in the second direction.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

In the following description, an integrated circuit of various embodiments formed on a substrate (100 of FIG. 2), for example, a semiconductor substrate, is provided. The integrated circuit has a layout that includes various standard cells. The standard cells are integrated circuit structures that are predesigned for a repeated use in the design of individual integrated circuits. Effective integrated circuit design layouts may include various predesigned standard cells, and predefined rules relating to placement of the standard cells to enhance circuit performance and reduce a circuit area.

An integrated circuit according to some embodiments may include one or more standard cells disposed in an integrated circuit layout by predefined rules. Such standard cells are used repeatedly in the integrated circuit design. Therefore, the standard cells are predesigned in accordance with fabricating technology and stored in the standard cell library. An integrated circuit designer may retrieve such standard cells and include them in integrated circuit design, and may place them in the integrated circuit layout in accordance with predefined placement rules.

The standard cell may include various basic circuit devices, such as an inverter, an AND, a NAND, an OR, a XOR and a NOR frequently used in designing a digital circuit for an electronic device, such as a central processing unit (CPU), a graphic processing unit (GPU) and a system-on-chip (SOC) design. The standard cell may include other elements frequently used in a circuit block, such as a flip-flop and a latch.

FIGS. 1 to 5, 6A, 6B, 7A, 7B, 8 to 10, 11A, 11B, 12, and 13 are diagrams for explaining an integrated circuit according to some embodiments.

Figure 1:
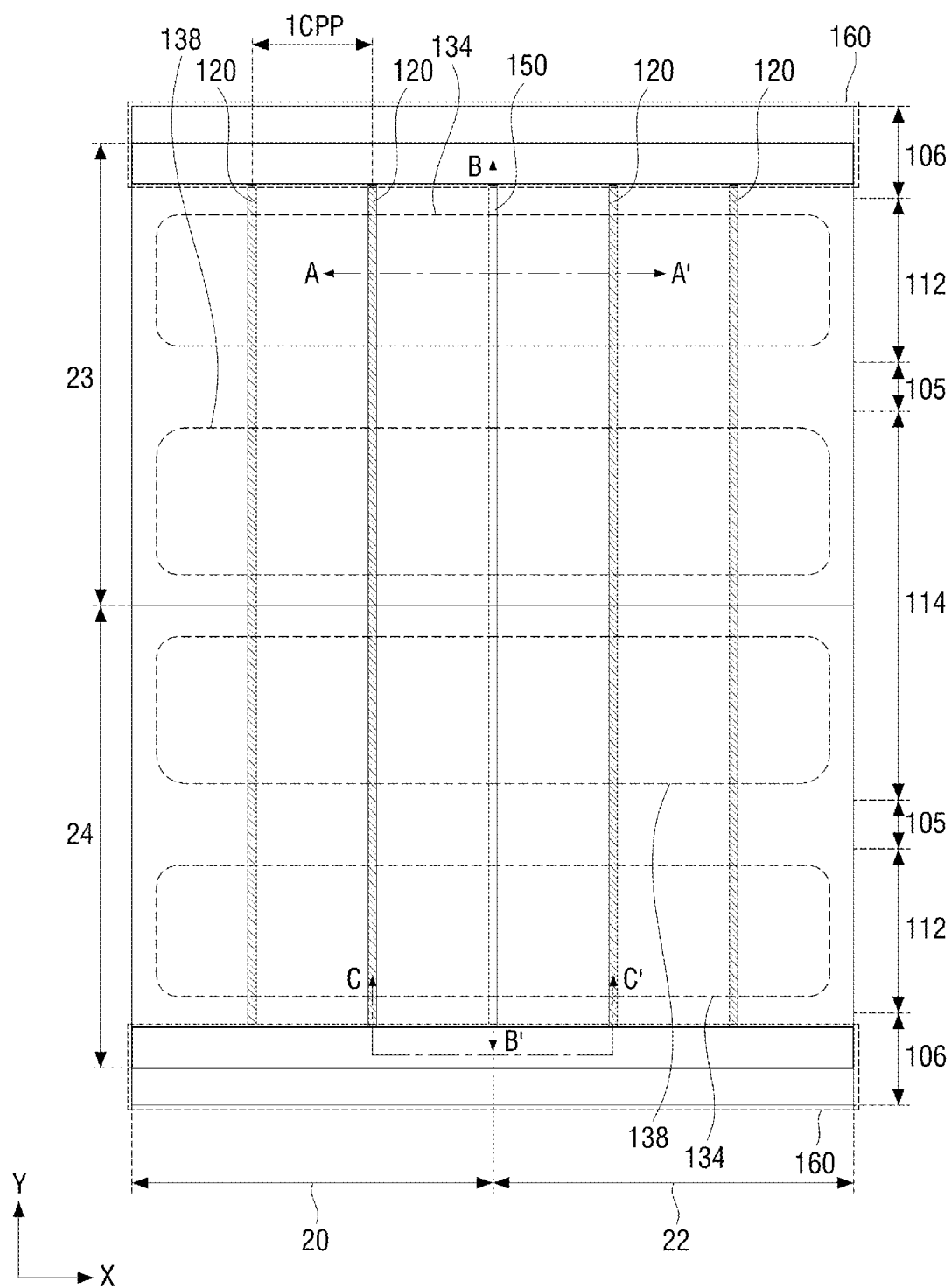
FIG. 1 is a top view of an integrated circuit showing up to front-end-of-line (FEOL) according to some embodiments.
Figure 2:
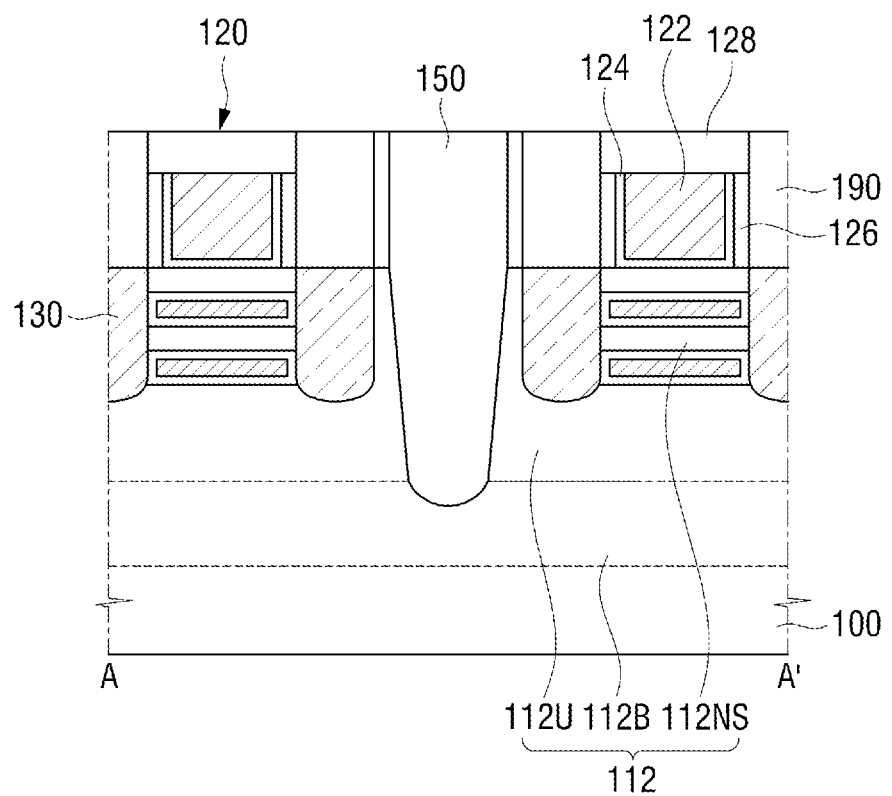
FIG. 2 is a cross-sectional view taken along a line A-A' of FIG. 1 according to some embodiments.
Figure 3:
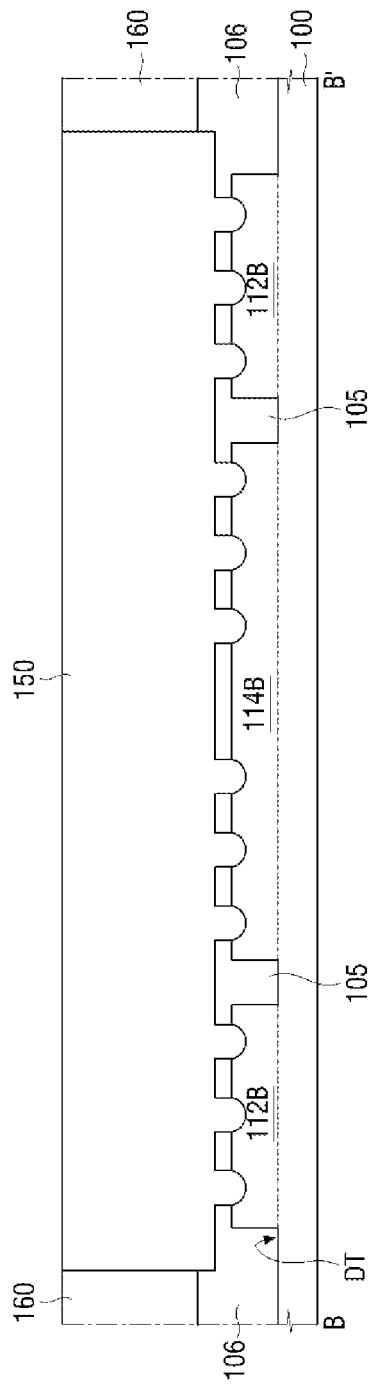
FIG. 3 is a cross-sectional view taken along a line B-B' according to some embodiments.
Figure 4:
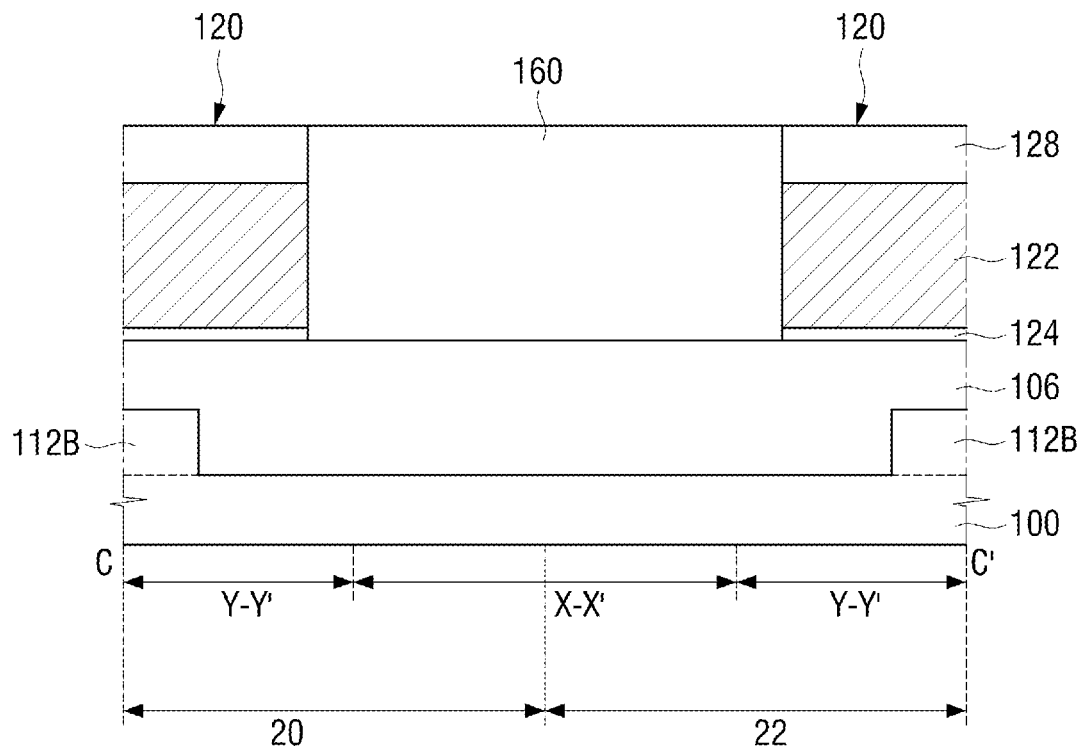
FIG. 4 is a cross-sectional view taken along a line C-C' of FIG. 3 according to some embodiments.
Figure 5:
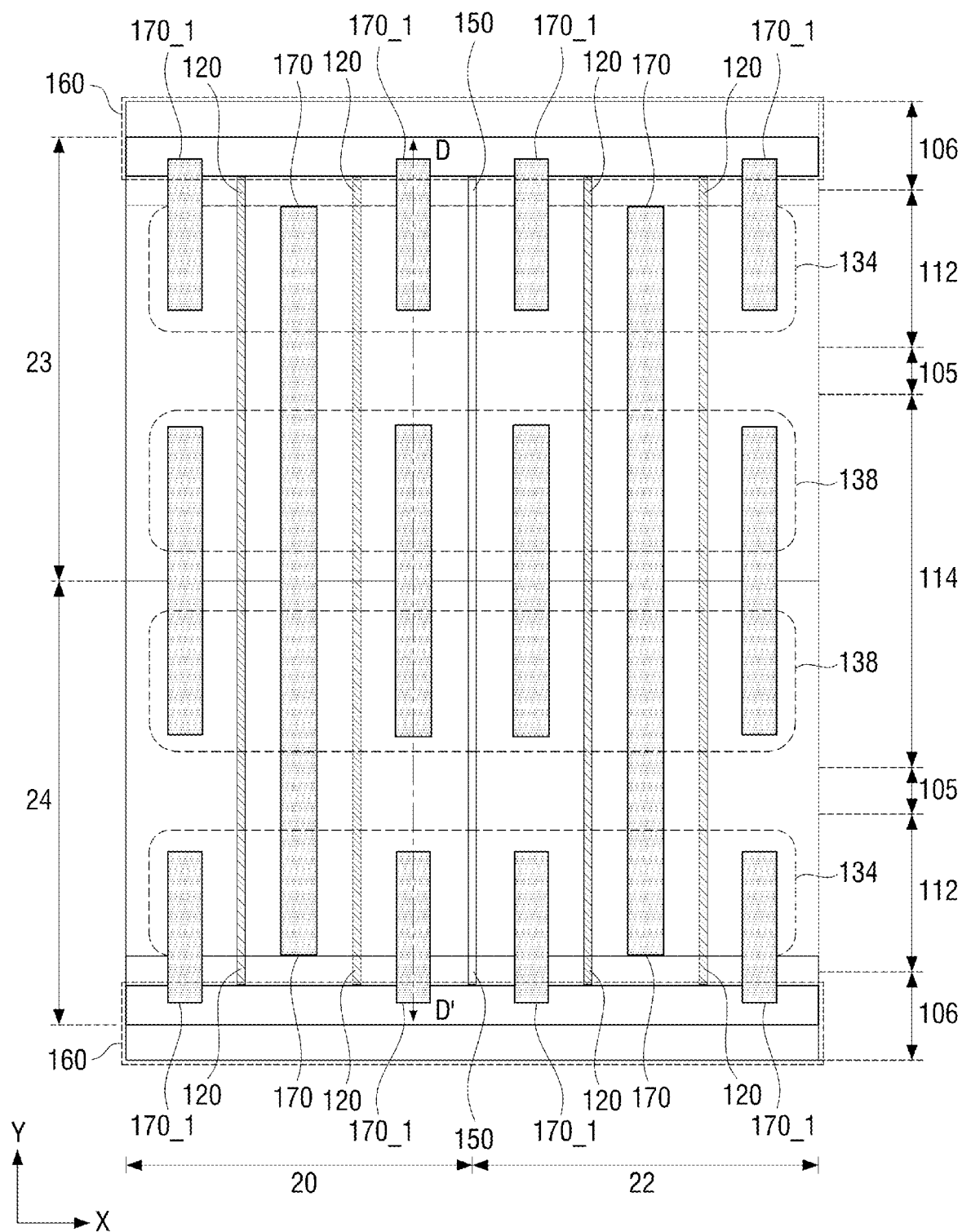
FIG. 5 is a top view of the integrated circuit showing up to middle-of-line (MOL) according to some embodiments.
Figure 6A:
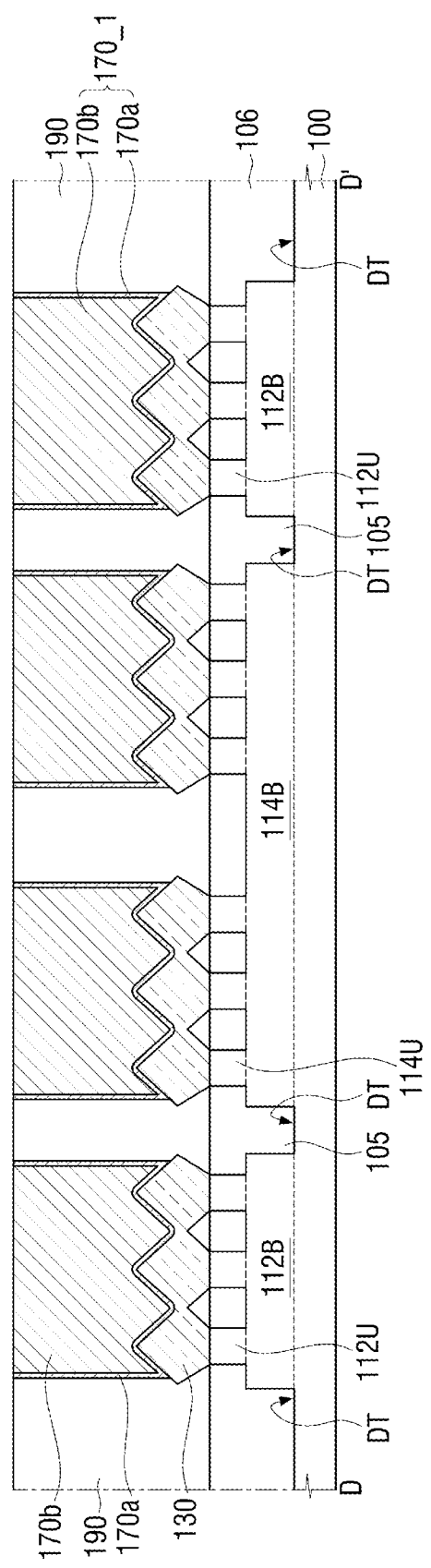
FIGS. 6A and 6B are cross-sectional views taken along a line D-D' of FIG. 5 according to some embodiments.
Figure 6B:
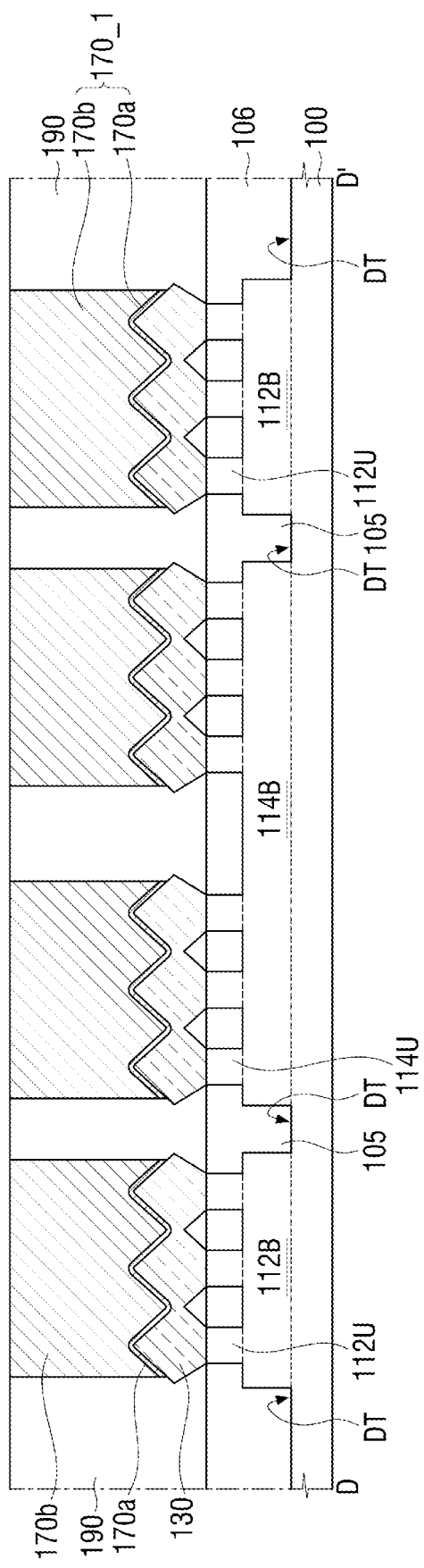
Figure 7A:
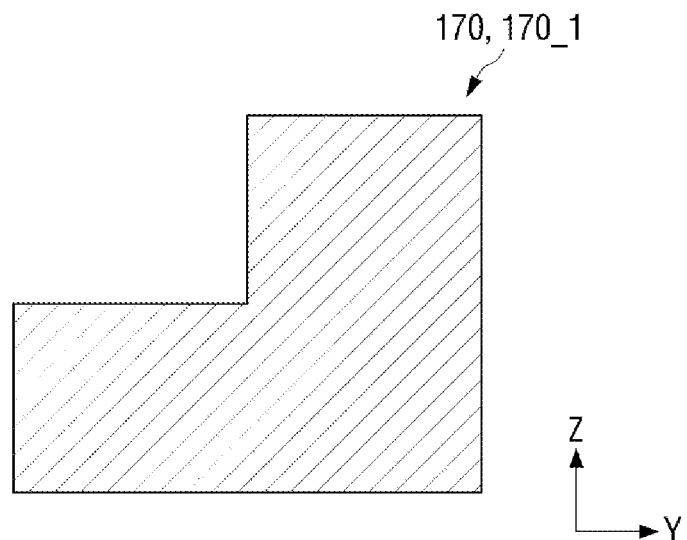
FIGS. 7A and 7B are various views that may be seen by cutting source/drain contacts 170 and 170_1 of FIG. 5 in a second direction Y according to some embodiments.
Figure 7B:
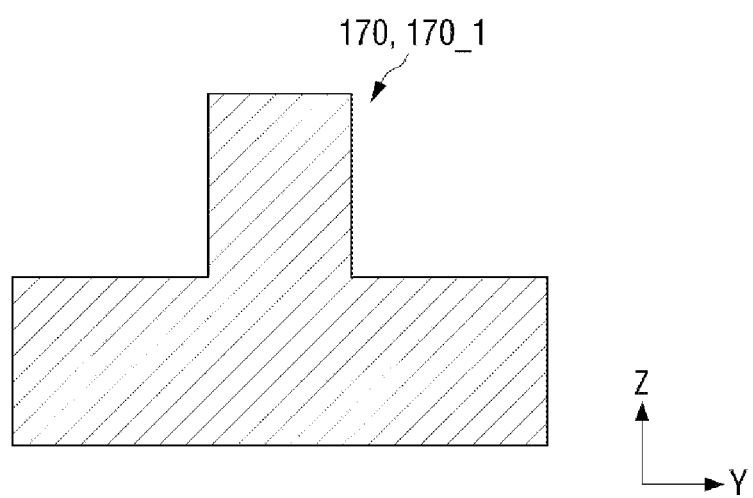
Figure 8:
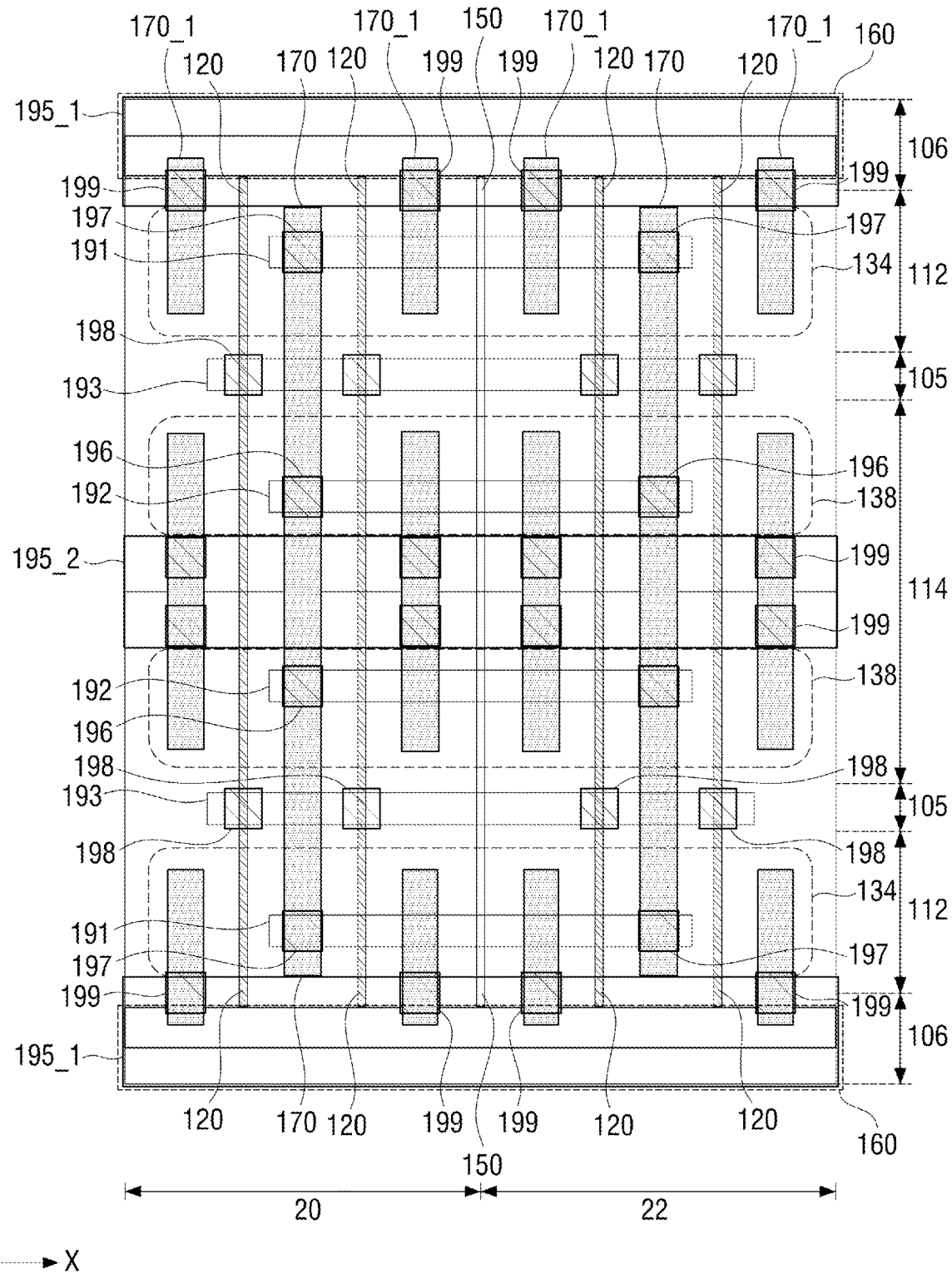
FIGS. 8 to 10 are top views of the integrated circuits showing from middle-of-line (MOL) to back-end-of-line (BEOL) according to some embodiments.
Figure 9:
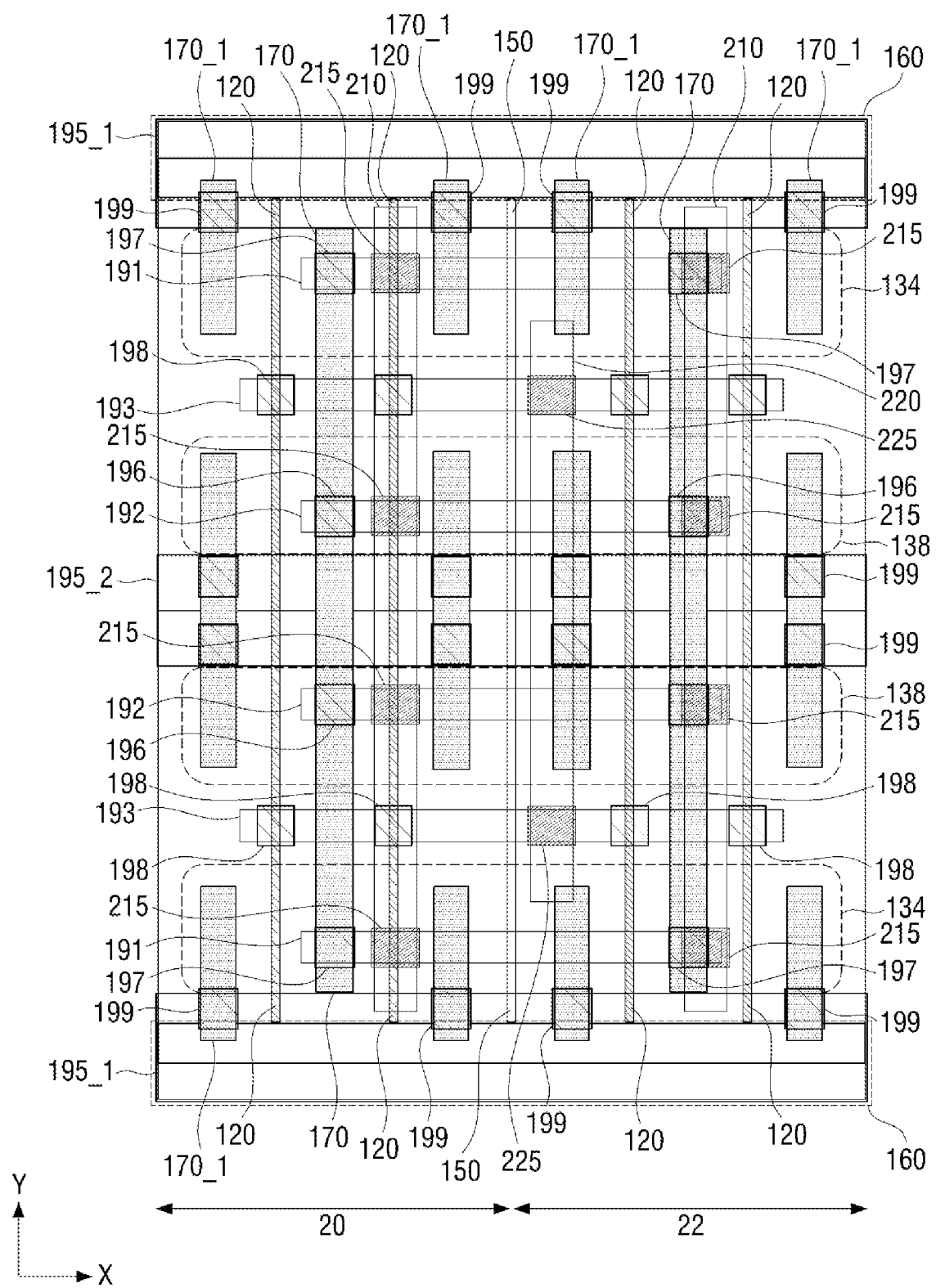
Figure 10:
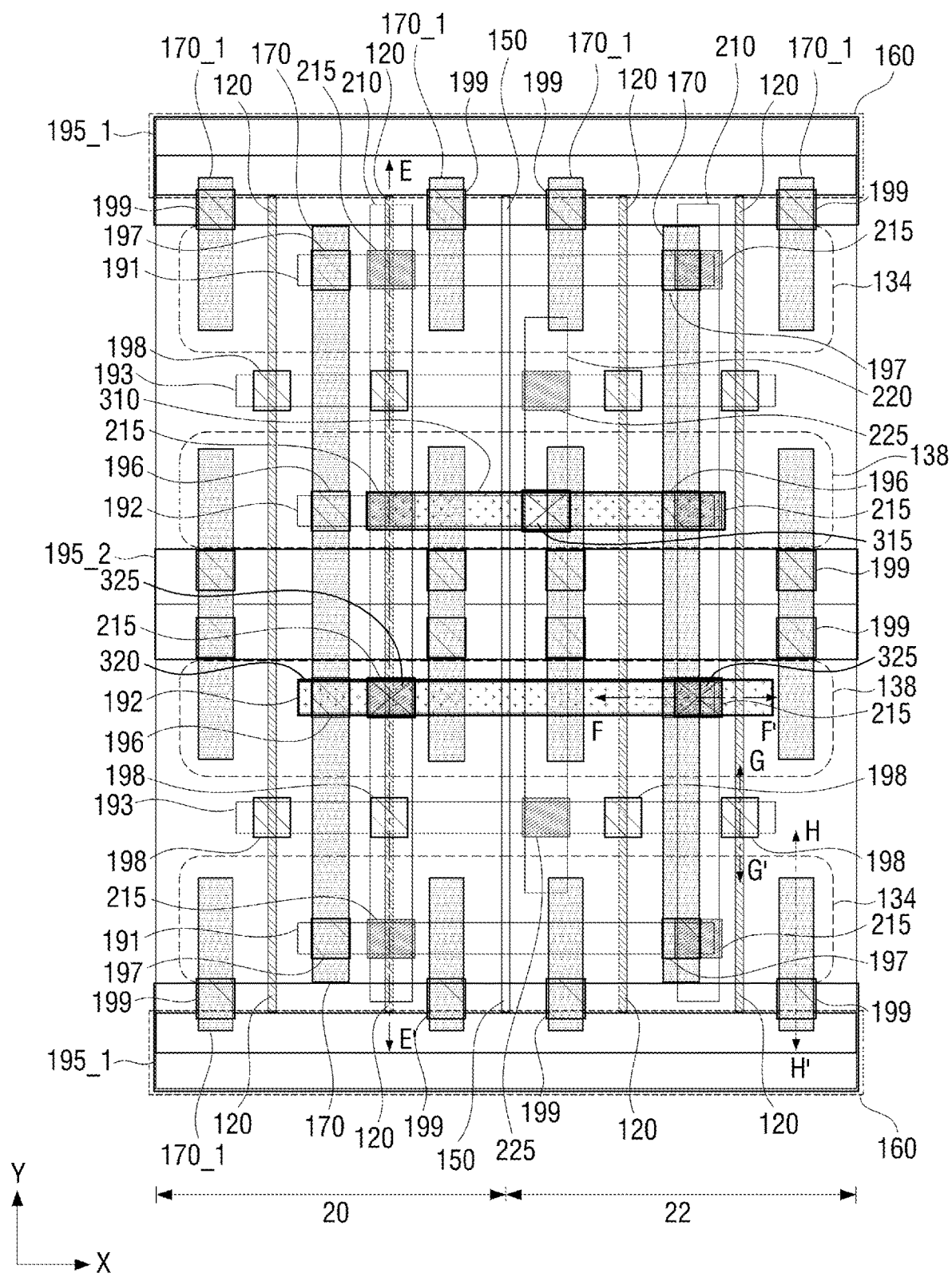
Figure 11A:
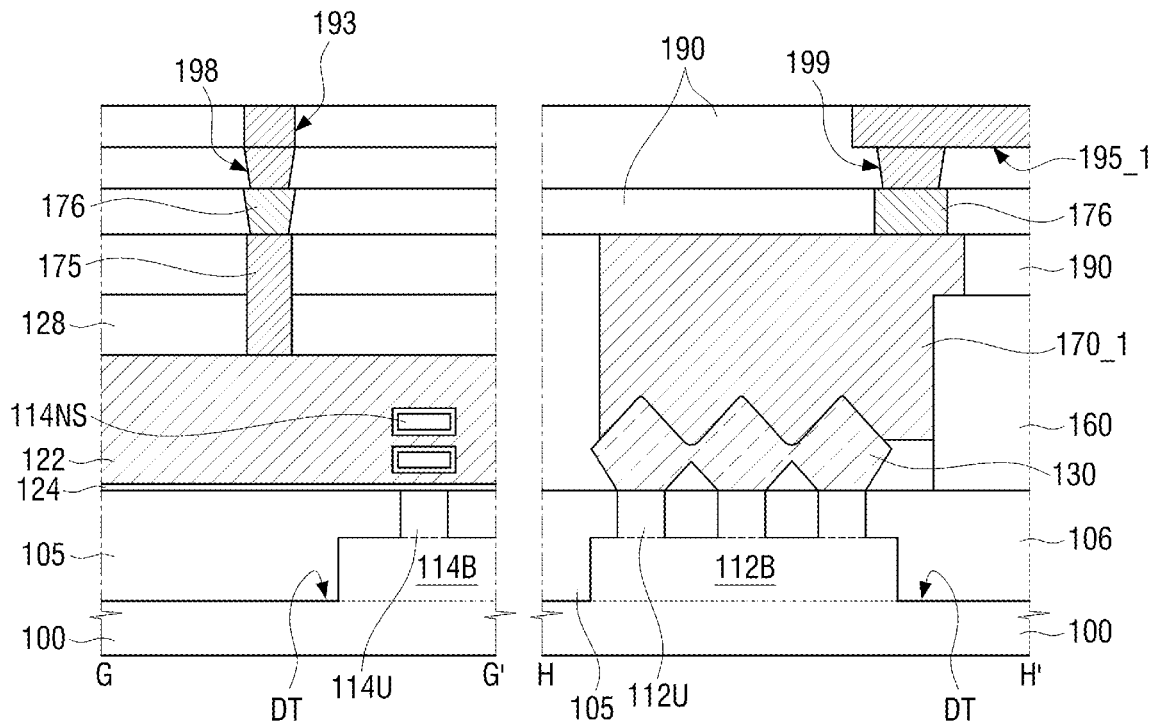
FIGS. 11A and 11B are other exemplary cross-sectional views taken along lines G-G' and H-H' of FIG. 10 according to some embodiments.
Figure 11B:
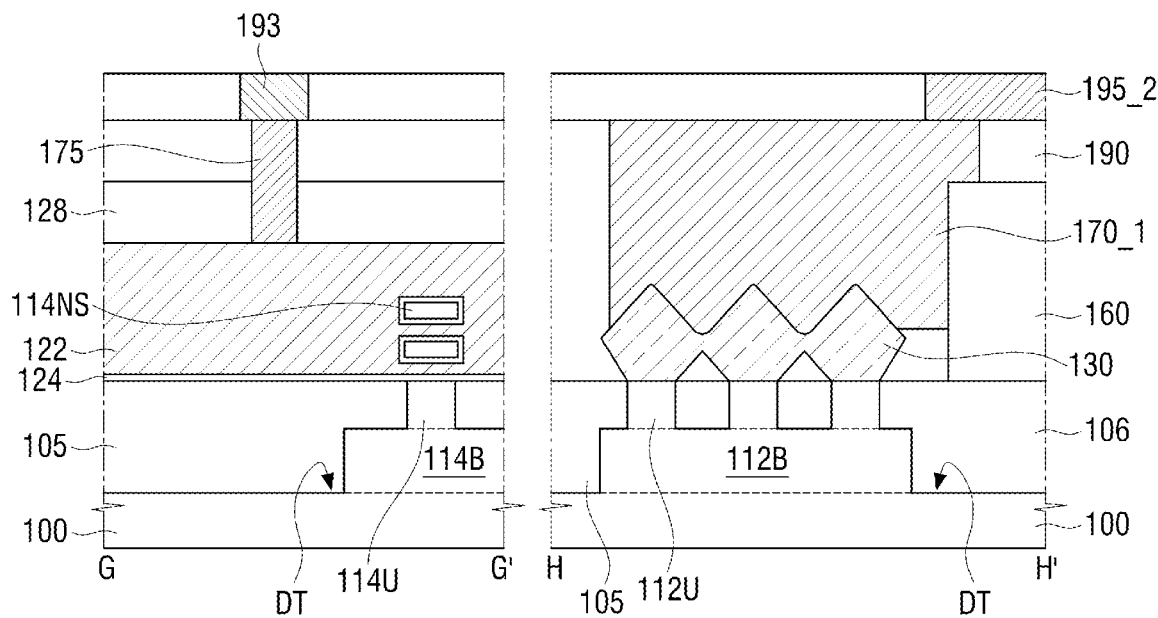
Figure 12:
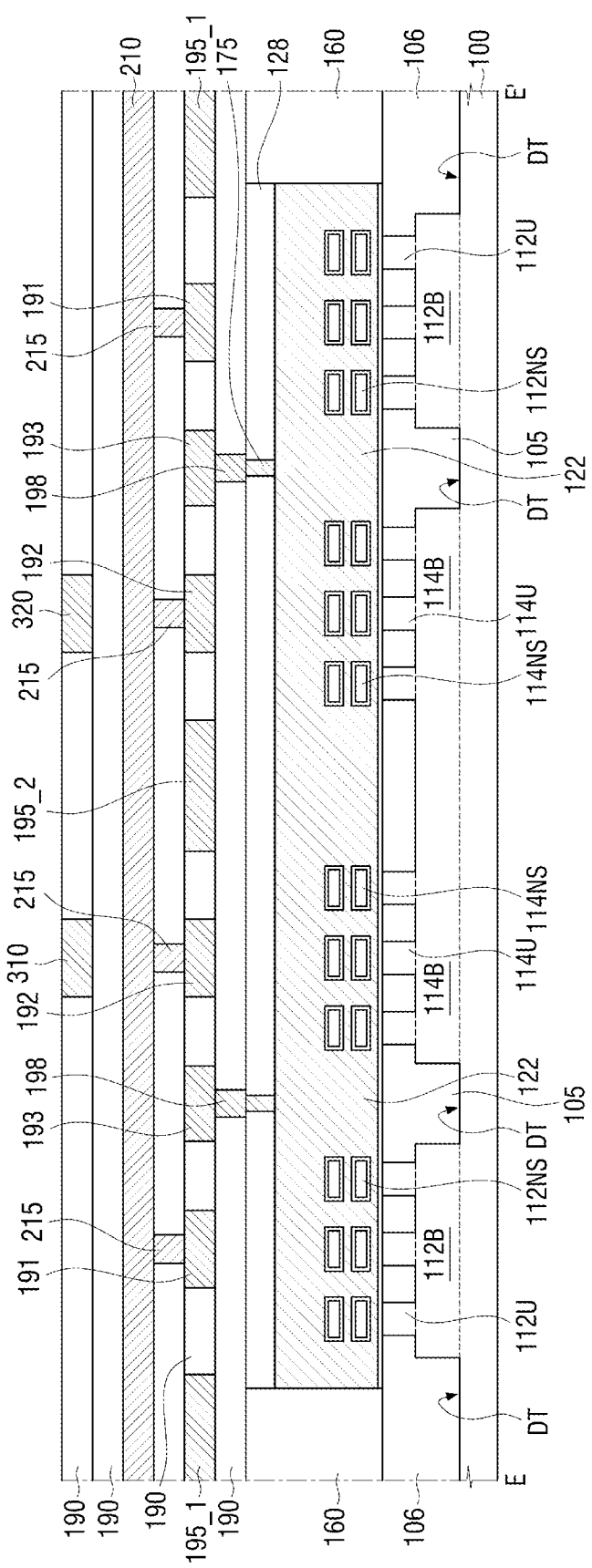
FIG. 12 is a cross-sectional view taken along a line E-E' of FIG. 10.
Figure 13:
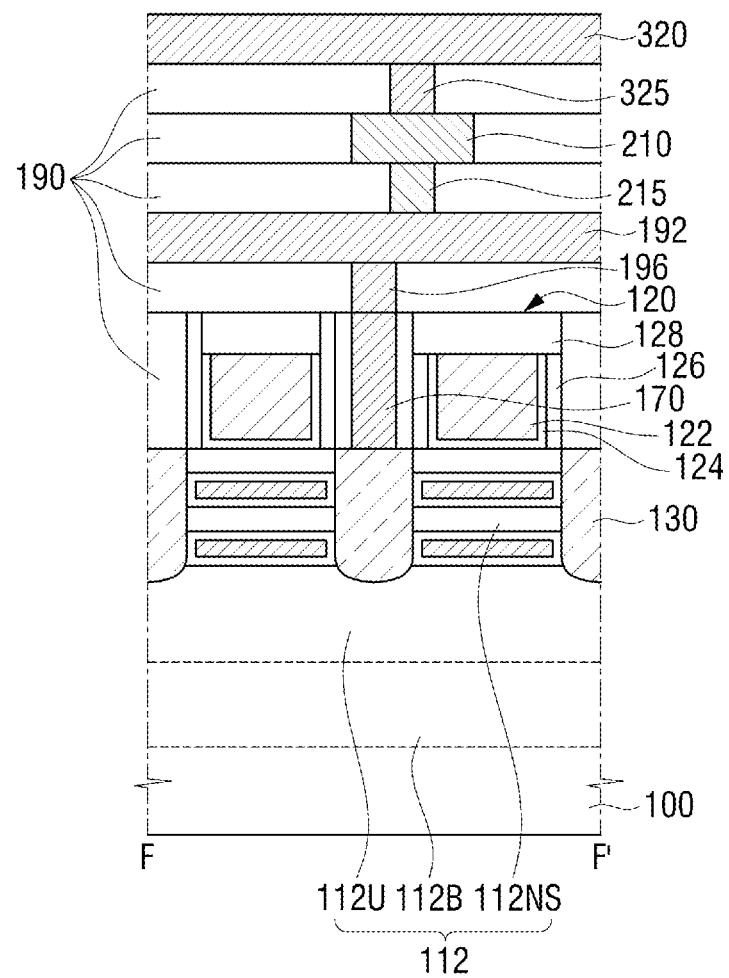
FIG. 13 is a cross-sectional view taken along a line F-F' of FIG. 10 according to some embodiments.

FIG. 1 is a top view of an integrated circuit showing up to front-end-of-line (FEOL) according to some embodiments. FIG. 2 is a cross-sectional view taken along a line A-A of FIG. 1. FIG. 3 is a cross-sectional view taken along a line B-B. FIG. 4 is a cross-sectional view taken along a line C-C of FIG. 3. For reference, in FIG. 4, X-X and Y-Y may mean cut directions. FIG. 5 is a top view of the integrated circuit according to some embodiments showing up to middle-of-line (MOL). FIGS. 6A and 6B are cross-sectional views taken along a line D-D' of FIG. 5, respectively. FIGS. 7A and 7B are various views that may be seen by cutting source/drain contacts 170 and 170_1 of FIG. 5 in a second direction Y. FIGS. 8 to 10 are top views of the integrated circuits according to some embodiments, showing from middle-of-line (MOL) to back-end-of-line (BEOL). FIGS. 11A and 11B are other exemplary cross-sectional views taken along lines G-G' and H-H' of FIG. 10. FIG. 12 is a cross-sectional view taken along a line E-E' of FIG. 10. FIG. 13 is a cross-sectional view taken along a line F-F' of FIG. 10.

Referring to FIGS. 1 to 5, 6A, 6B, 7A, 7B, 8 to 10, 11A, 11B, 12, and 13, an integrated circuit 10 according to some embodiments may include a first standard cell 20 and a second standard cell 22. In FIG. 1, two standard cells 20 and 22 adjacent to each other in an X direction may be divided on the basis of an insulating gate 150.

In some embodiments, the first standard cell 20 may include 4 inverters having 8 transistors and the second standard cell 22 may include 4 inverters having 8 transistors. Although each of the first and second standard cells 20 and 22 is shown as having a 4 inverter structure, the embodiments are not limited thereto. In some examples, each of the first and second standard cells 20 and 22 may include 2 inverters having 4 transistors.

A FEOL process may be referred to as a process of forming individual elements such as transistors, capacitors, and resistors on a substrate in an integrated circuit manufacturing process. For example, the FEOL process may include planarizing and cleaning a wafer, forming a trench, forming a well, forming a gate line, forming a source/drain, and the like.

The substrate 100 may be a silicon substrate or silicon-on-insulator (SOI). Alternatively, the substrate 100 may include, but is not limited to, silicon germanium, silicon germanium on insulator (SGOI), indium antimonide, lead telluride, indium arsenide, indium phosphide, gallium arsenide or gallium antimonide.

Referring to FIGS. 1 and 12, a first active region (an upper end 112) and a third active region (a lower end 112) may be defined along the first direction X. The first active region (the upper end 112) and the third active region (the lower end 112) may be defined by a deep trench DT. The first active region (the upper end 112) and the third active region (the lower end 112) may be regions in which p-type transistors are formed. Each of the first active region (the upper end 112) and the third active region (the lower end 112) may include, for example, a well region doped with an n-type impurity.

Each of the first active region (the upper end 112) and the third active region (the lower end 112) may include a first lower active region 112B, a first upper active region 112U, and a first nanosheet 112NS. The first lower active region 112B may have a side wall defined by the deep trench DT. The first upper active region 112U may have a fin shape protruding from the first lower active region 112B. The first upper active region 112U may have a side wall defined by a trench that is shallower than the deep trench DT. The first nanosheet 112NS may be disposed to be spaced apart from the first upper active region 112U. Although the two first nanosheets 112NS are shown, this is merely for convenience of explanation and the number thereof is not limited thereto.

A second active region 114 may be defined along the first direction X. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. The second active region 114 may be defined to be spaced apart from the first active region 112 in a second direction Y. The first active region 112 and the second active region 114 may be separated by the deep trench DT. The second active region 114 may be a region in which n-type transistors are formed. The second active region 114 may include, for example, a well region doped with a p-type impurity.

The second active region 114 may include a second lower active region 114B, a second upper active region 114U, and a second nanosheet 114NS. The second lower active region 114B may have a side wall defined by the deep trench DT. The second upper active region 114U may have a fin shape protruding from the second lower active region 114B. The second upper active region 114U may have a side wall defined by a trench that is shallower than the deep trench DT. The second nanosheet 114NS may be disposed to be spaced apart from the second upper active region 114U. Although the two second nanosheets 114NS are shown, this is merely for convenience of explanation and the number thereof is not limited thereto.

Each of the standard cells may include a first active region 112, a second active region 114, and a third active region 112.

An active region isolation film 105 may be formed on the substrate 100. The active region isolation film 105 may cross between the first active region 112 and the second active region 114, and between the second active region 114 and the third active region 112. The active region isolation film 105 may extend in the first direction X. The active region isolation film 105 may fill the deep trench DT that divides the first active region 112 and the second active region 114 of a first standard cell.

The cell isolation film 106 may be formed on the substrate 100. The cell isolation film 106 may fill the deep trench DT that divides the first active region 112, the second active region 114, and the third active region 112 of a first standard cell and the first active region 112, the second active region 114, and the third active region 112 of a second standard cell. The cell isolation film 106 may extend in the first direction X along a boundary between the first and second standard cells. The active region isolation film 105 and the cell isolation film 106 may each include an insulating material.

The active region isolation film 105 and the cell isolation film 106 may include an insulating material that fills the deep trench DT which defines the first active region 112, the second active region 114 and the third active region 112. In the following description, the active region isolation film 105 may be an insulating material film disposed between the first active region 112 and the second active region 114 included in a single cell (hereinafter, a cell may be referred to as a standard cell), and between the second active region 114 and the third active regions 112 included in the single cell. For example, the active region isolation film 105 may be explained as being an insulating material film disposed inside the cell. The cell isolation film 106 may be an insulating material film which is not disposed inside the cell but extends along a cell boundary extending in the first direction X among the cell boundaries. For example, the cell isolation film 106 may be explained as being an insulating material film disposed along the cell boundary.

An integrated circuit according to some embodiments may include a plurality of gate stacks 120 and a plurality of insulating gates 150. The gate stacks 120 and the insulating gates 150 may each extend along the second direction Y. The gate stacks 120 and the insulating gates 150 may be disposed to be adjacent to each other in the first direction X.

As an example, the gate stacks 120 disposed to be adjacent to each other in the first direction X may be spaced apart from each other by 1CPP (contacted poly pitch; it is not only referred to as "CPP", but also referred as "grid"). As another example, the gate stack 120 and the insulating gate 150 adjacent to each other may be spaced apart from each other by 1CPP.

For example, assuming that there are first and second gate stacks adjacent to each other, if a distance between a center line of the first gate stack extending in the second direction Y and a center line of the second gate stack extending in the second direction Y is 1CPP, it may mean that no other gate stack or insulating gate is located between the first gate stack and the second gate stack.

The gate stack 120 and the insulating gate 150 may be disposed over the first active region 112, the second active region 114, and the third active region 112, respectively. The gate stack 120 and the insulating gate 150 may cross the active region isolation film 105. A part of the gate stack 120 and a part of the insulating gate 150 may extend onto each cell isolation film 106.

In FIG. 13, the gate stack 120 may include a gate electrode 122, a gate insulating film 124, a gate spacer 126, and a gate capping film 128. In some examples, the gate stack 120 may not include the gate capping film 128. The gate spacer 126 may define a gate trench in which the gate insulating film 124 and the gate electrode 122 may be formed. The gate spacer 126 may include, for example, an insulating material. The gate insulating film 124 may be formed along the periphery of the first nanosheet 112NS. Although it is not shown, the gate insulating film 124 may be formed along the periphery of the second nanosheet 114NS. The gate insulating film 124 may include, for example, at least one of silicon oxide or a high dielectric constant material. The high dielectric constant material may be, for example, a material having a dielectric constant higher than silicon oxide. The gate electrode 122 may be formed on the gate insulating film 124. The gate electrode 122 may wrap the first nanosheet 112NS. Although it is not shown, the gate electrode 122 may wrap the second nanosheet. The gate electrode 122 may include, for example, at least one of a metal (which is meant to include a metal alloy including two or more metals), a metal nitride, a metal carbide, a metal silicide, and a semiconductor material. The gate capping film 128 may be disposed on the gate electrode 122. The gate capping film 128 may include, for example, an insulating material.

The insulating gate 150 may separate at least a part of the first active region 112 into separate sub-regions, may separate at least a part of the third active region 112 into separate sub-regions, and may separate at least a part of the second active region 114 into separate sub-regions. The insulating gate 150 may include, for example, an insulating material. Although the insulating gate 150 is shown as a single film, the embodiment is not limited thereto. For example, the insulating gate 150 may include a stack structure including at least two films. As shown in FIG. 2, the insulating gate 150 may separate the first upper active region 112U of the first and third active regions 112. Although the insulating gate 150 is shown as penetrating a part of the first lower active region 112B of the first and third active regions 112, the embodiments are not limited thereto. In order to electrically separate adjacent elements, the insulating gate 150 may completely separate the first lower active region 112B. Although it is not shown, the insulating gate 150 may separate the second upper active region 114U of the second active region 114, and may penetrate a part of the second lower active region 114B. Considering a fabricating process of forming the insulating gate 150, after removing at least a part of the first active region 112 and at least a part of the second active region 114, an insulating material is filled in the portion from which the second active region 114 and the first active region 112 are removed. Therefore, the insulating gate 150 may be formed. Therefore, a part of the side wall of the insulating gate 150 may be in contact with the first active region 112 and the second active region 114. A part of the side wall of the insulating gate 150 may be in contact with a semiconductor material film included in the first active region 112 and the second active region 114.

In FIG. 3, the insulating gate 150 may cross the active region isolation film 105. The insulating gate 150 may be disposed on the active region isolation film 105. A part of the insulating gate 150 may be recessed into the active region isolation film 105. In the process of forming the insulating gate 150, a part of the active region isolation film 105 may be removed. Therefore, a part of the insulating gate 150 may be recessed into the active region isolation film 105. A gate spacer 126 may be disposed on the side wall of the insulating gate 150.

In the integrated circuit according to some embodiments, at least a part of the insulating gate 150 may be located at a boundary of a standard cell extending in the second direction Y to separate adjacent standard cells. The insulating gate 150 may be located inside the standard cell as well as at the boundary of the standard cell. However, hereinafter, the insulating gate 150 may be explained as being located at the boundary of the standard cell extending in the second direction Y.

In FIG. 2, a semiconductor pattern 130 may be formed between the gate stack 120 and the insulating gate 150 adjacent to each other. The semiconductor pattern 130 may be formed by removing a part of the active regions 112 and 114 to form a recess, and then filling the recess through an epitaxial process. The semiconductor pattern 130 may be formed on the first active region 112. In FIGS. 6A and 6B, the semiconductor pattern 130 may be formed on the second active region 114. At least a part of the semiconductor pattern 130 may be included in a source/drain region of the transistor. The semiconductor pattern 130 formed on the first active region 112 may be doped with an impurity of a conductivity type different from that of the semiconductor pattern 130 formed on the second active region 114. The semiconductor pattern 130 may also be formed in a place adjacent to the insulating gate 150.

In FIGS. 1, 3, and 4, a cell gate cutting pattern 160 may be disposed on the cell isolation film 106. The cell gate cutting pattern 160 may extend in the first direction X. The cell gate cutting pattern 160 may extend in the first direction X along a boundary between the first and second standard cells. The gate stack 120 and the insulating gate 150 may be disposed between the cell gate cutting patterns 160 spaced apart from each other in the second direction Y. The cell gate cutting pattern 160 may include, for example, an insulating material.

The cell gate cutting pattern 160 may cut the gate stack 120 or the insulating gate 150 at the boundary of the cell. The cell gate cutting pattern 160 may be in contact with the gate stack 120 and the insulating gate 150. The cell gate cutting pattern 160 may be in contact with a short side of the gate stack 120 and a short side of the insulating gate 150 extending in the first direction X. The first standard cell 20 and the second standard cell 22 may further include a cell gate cutting pattern 160 formed along a boundary extending in the first direction X.

In FIG. 4, X-X' and Y-Y' may mean cut directions. The gate insulating film 124 may not be formed on the side walls of the cell gate cutting pattern 160, according to some embodiments. Although it is not shown, according to some embodiments, the gate insulating film 124 may extend along the side walls of the cell gate cutting pattern 160. Such a difference may vary depending on the step in which the cell gate cutting pattern 160 is formed. When the cell gate cutting pattern 160 is formed after the formation of the gate electrode 122, as shown in FIG. 4, the gate insulating film 124 may not be formed on the side wall of the cell gate cutting pattern 160. For example, when the cell gate cutting pattern 160 is formed before formation of the gate electrode 122 (a mold gate step for forming the gate electrode 122), the gate insulating film 124 may extend along the side walls of the cell gate cutting pattern 160.

The first standard cell 20 may include one or more gate stacks 120 disposed between the insulating gates 150 located at a boundary of the first standard cell. In FIG. 1, the first standard cell may have a width of 3CPP.

The second standard cell 22 may form a boundary with the first standard cell on the basis of the insulating gate 150. The second standard cell 22 may include one or more gate stacks 120 disposed between the insulating gates 150 located at the boundary of the second standard cell 22. In FIG. 1, the second standard cell 22 may have a width of 3CPP.

The first standard cell 20 may include a first active region 112, a second active region 114, and a third active region 112. The gate stack 120 included in the first standard cell 20 may intersect the first active region 112, the second active region 114, and the third active region 112.

In some embodiments, in FIG. 5, the first standard cell 20 may include first p-type transistors 134, first n-type transistors 138, second n-type transistors 138 and second p-type transistors 134. The second standard cell 22 may include first p-type transistors 134, first n-type transistors 138, second n-type transistors 138 and second p-type transistors 134. For the sake of convenience of placement of the active region in view of a design, while the p-type active regions and the n-type active regions are alternately arranged, the transistors are disposed in series in the order of p-type-n-type-n-type-p-type. However, this is merely for convenience of description, and it is obvious that the present embodiments are also applicable to a case where the impurity type is reversed so that the p-type is changed to then n-type, and the n-type is changed to the p-type.

The first p-type transistors 134 may be formed at a position where the gate stack 120 and the first active region 112 intersect, and the first n-type transistors and the second n-type transistors 138 and 138 may be formed at a position where the gate stack 120 and the second active region 114 intersect, and the second p-type transistors 134 may be formed at a position where the gate stack 120 and the third active region 112 intersect. For example, each of the first and second p-type transistors 134 may include a gate electrode 122, a first nanosheet 112NS as a channel region, and a semiconductor pattern 130 as a source/drain region.

The first p-type transistors 134 and the second p-type transistors 134 are formed on the first active region 112, and the first n-type transistors 138 and the second n-type transistors 138 are formed on the second active region 114.

Referring to FIGS. 5, 6A, 6B, 7A, and 7B, the integrated circuit according to some embodiments may include source/drain contacts 170 and 170_1.

The source/drain contacts 170 and 170_1 may be disposed on the first active region 112, the second active region 114, and the third active region 112. The source/drain contacts 170 and 170_1 may be connected to the semiconductor pattern 130 formed on the first active region 112, the second active region 114, and the third active region 112. As used herein, the term "electrically connected" may be used to describe items configured such that an electrical signal can be passed from one item to the other. In contrast, a passive electrically conductive component (e.g., a wire, pad, internal electrical line, etc.) physically connected to an insulating layer is not electrically connected to that component. The source/drain contacts 170 and 170_1 may include a normal source/drain contact 170 and an extended source/drain contact 170_1. The normal source/drain contact 170 may generally overlap the first active region 112, the second active region 114 or the third active region 112. A part of the extended source/drain contact 170_1 may extend onto the cell isolation film 106 and the cell gate cutting pattern 160. The extended source/drain contact 170_1 may be connected to power rails (195_1 and 195_2 of FIG. 8) to be described below.

In FIG. 12, a gate contact 175 is formed on the gate electrode 122 of the gate stack 120 and is not formed on the insulating gate 150. The gate contact 175 may be connected to the gate stack 120. For example, the gate contact 175 may be electrically connected to the gate electrode 122 of the gate stack 120.

Although not shown, the gate contact 175 may be disposed on the first active region 112, the second active region 114, and the third active region 112. Further, the gate contact 175 may also be formed on the active region isolation film 105. In the integrated circuit according to some embodiments, at least one of the gate contacts may be disposed at a position where it overlaps one of the first active region 112, the second active region 114, and the third active region 112.

Referring to FIG. 5, each of the first standard cell 20 and the second standard cell 22 may further include a normal source/drain contact 170, an extended source/drain contact 170_1, and a gate contact 175, respectively. The normal source/drain contact 170 of the first standard cell 20 or the second standard cell 22 may be continuously arranged inside each standard cell in the Y direction. For example, the extended source/drain contacts 170_1 of the first standard cell 20 or the second standard cell 22 may be arranged discontinuously inside each standard cell in the Y direction, respectively.

A MOL process may describe a process of contacting individual elements such as transistors, capacitors, and resistors on a substrate in an integrated circuit manufacturing process. For example, the MOL process may include forming source/drain contacts, and the like.

In FIG. 6A, the extended source/drain contact 170_1 may include a contact barrier film 170a and a contact filling film 170b. The contact filling film 170b may fill the trench defined by the contact barrier film 170a. For example, in FIG. 6B, the contact barrier film 170a may be formed only between the semiconductor pattern 130 and the contact filling film 170b, and may not be formed between the interlayer insulating film 190 and the contact filling film 170b. The normal source/drain contact 170 may also have a shape as shown in FIGS. 6A and 6B. In the subsequent drawings, the contact barrier film 170a and the contact filling film 170b may be shown as a single film without distinction.

FIGS. 7A and 7B show exemplary cross-sections of the source/drain contacts 170 and 170_1. FIGS. 7A and 7B may be cross-sectional views taken along the second direction Y.

As the gate contact (not shown) is disposed on the first active region 112, the second active region 114 and the third active region 112, a short margin between the gate contact and the source/drain contacts 170 and 170_1 may be considered. For example, depending on whether the gate contact is located around the source/drain contacts 170 and 170_1, the cross-sections of the source/drain contacts 170 and 170_1 have an L-shape (FIG. 7A) or has a T-shape rotated by 180 degrees (FIG. 7B). If no gate contact is disposed around the source/drain contacts 170 and 170_1, the source/drain contacts 170 and 170_1 may have a cross-section as shown in FIGS. 6A and 6B.

In FIGS. 8 to 10, 11A, 11B, 12 and 13, an integrated circuit according to some embodiments may include source/drain contacts 170 and 170_1 disposed across the first active region 112, the second active region 114 and the third active region 112 extending in the first direction of FIG. 5, the gate stack 120 and the insulating gate stack 150 traversing in the second direction, and a plurality of wiring layers above the gate contact.

In FIG. 8, the integrated circuit according to some embodiments may further include source/drain vias 196 and 197, a gate via 198, wiring patterns (or, wiring lines) 191, 192 and 193, and power rails 195_1 and 195_2.

A BEOL process may describe a process of interconnecting individual elements such as transistors, capacitors, and resistors on a substrate in an integrated circuit manufacturing process. For example, the BEOL process may include silicidating gate source, and drain regions, adding dielectric, planarizing, forming holes, adding metal layers, forming vias, forming passivation layers, and the like.

A first wiring layer may include a plurality of wiring patterns (or, wiring lines) parallel to the Y direction while extending in the X direction. The first wiring layer may include, for example, six wiring lines. The six wiring lines may be first through sixth wiring lines 191, 193, 192, 192, 193, and 191. Each of the first standard cell 20 and the second standard cell 22 may include the source/drain vias 196 and 197 which connect the wiring patterns 191 and 192 of the first wiring layer and the source/drain contact 170, the gate via 198 which connects the wiring pattern 193 of the first wiring layer and the gate contact 175, the wiring patterns 191, 192 and 193 of the first wiring layer, and the power rails 195_1 and 195_2.

The gate via 198 may be formed on the gate contact 175. The gate via 198 may connect the gate contact 175 to the wiring patterns 191, 192 and 193. The source/drain vias may further include a power rail via 199. The source/drain vias 196, 197 and 199 may be formed on the source/drain contacts 170 and 170_1. The source/drain vias 196, 197 and 199 may be connected to at least a part of the source/drain contacts 170 and 170_1. The source/drain vias 196, 197 and 199 may include normal vias 196 and 197 which connect the normal source/drain contact 170 and the wiring patterns 191 and 193, and the power rail via 199 which connects the extended source/drain contacts 170_1 and the power rails 195_1 and 195_2. The power rail via 199 may further extend in the Y direction beyond the extended source/drain contact 170_1. The power rails 195_1 and 195_2 may include an upper power rail 195_1 to which a first voltage is supplied, and a lower power rail 195_2 to which a second voltage is supplied. The upper power rail 195_1 may supply a power to the p-type transistor, and the lower power rail 195_2 may supply a power to the n-type transistor. For example, the upper power rail 195_1 may supply a high power (e.g., VCC or VDD) to the p-type transistor, and the lower power rail 195_2 may supply a low power (e.g., GND) to the n-type transistor.

In FIG. 11A, although not shown, a middle contact 176 may be further interposed between the source/drain vias 196 and 197 and the source/drain contact 170. The middle contact 176 may also be interposed between the power rail via 199 and the source/drain contact 170_1. The middle contact 176 may also be interposed between the gate via 198 and the gate contact 175. Although the wiring pattern 193 and the gate via 198 are shown as having an integrated structure, the embodiment is not limited thereto. The wiring pattern 193 and the gate via 198 may be divided by a barrier film.

In FIG. 11B, although not shown, the source/drain contact 170 may be connected to the wiring patterns 191 and 192 without the source/drain vias 196 and 197. The source/drain contact 170_1 may be connected to the power rails 195_1 and 195_2 without the source/drain via 199. The gate contact 175 may be connected to the wiring pattern 193 without the gate via 198.

The first wiring layer may include a plurality of wiring lines parallel to the Y direction while extending in the X direction. The first wiring layer may include, for example, six wiring lines. The first wiring line 191 may connect a drain contact of the first p-type transistors 134 of the first standard cell 20 and a drain contact of the second p-type transistors 134 of the second standard cell 22 through the source/drain via 197. The second wiring line 193 may connect gate contacts of the first p-type transistors 134 of the first standard cell 20 and gate contacts of the first n-type transistors 138 of the first standard cell 20 through the gate via 198, and may connect gate contacts of the second p-type transistors 134 of the second standard cell 22 and gate contacts of the second n-type transistors 138 of the second standard cell 22 through the gate via 198. The third wiring line 192 may connect a drain contact of the first n-type transistors 138 of the first standard cell 20 and a drain contact of the second n-type transistors 138 of the second standard cell 22 through the source/drain via 196. The fourth wiring line 192 may connect a drain contact of the third n-type transistors 138 of the first standard cell 20 and a drain contact of the fourth n-type transistors of the second standard cell 22 through the source/drain via 196. The fifth wiring line 193 may connect the third and fourth p-type transistors 134 of each of the first standard cell 20 and the second standard cell 22 to the gate contacts of the third and fourth n-type transistors 138 of each of the first standard cell 20 and the second standard cell 22 through the gate via 198. The sixth wiring line 191 may connect a drain contact of the third p-type transistors 134 of the first standard cell 20 and a drain contact of the fourth p-type transistors 134 of the second standard cell 22 through the source/drain via 197. For example, each of the drain contacts of the first and third p-type transistors 134 of the first standard cell 20 are continuously arranged in the Y direction, and each of the drain contacts of the second and fourth n-type transistors 138 are continuously arranged in the Y direction.

In some embodiments, the second wiring line 193 and the fifth wiring line 193 may be connected to each of the gate contacts 175 without the gate via 198.

In FIG. 9, the integrated circuit according to some embodiments may further include a second wiring layer including a plurality of wiring lines extending in the Y direction and parallel to the X direction.

The second wiring layer may include at least three wiring lines. The three wiring lines may be seventh through ninth wiring lines 210, 220, and 210. The seventh wiring line 210 may electrically connect the first wiring line 191, the third wiring line 192, the fourth wiring line 192 and the sixth wiring line 191 of the first standard cell 20 through via 215. The eighth wiring line 220 may electrically connect the second wiring line 193 and the fifth wiring line 193 through the via 225. The ninth wiring line 210 may electrically connect the first wiring line 191, the third wiring line 192, the fourth wiring line 192 and the sixth wiring line 191 of the second standard cell 22 through the via 215.

According to some embodiments, the seventh wiring line 210 may be disposed on the gate stack 120 of the first standard cell 20 to be spaced apart in a Z direction vertical to the top surface of the substrate 100. The eighth wiring line 220 may be disposed to partially overlap the extended source/drain contact region 170_1 of the second standard cell 22, while being formed to extend in the Y direction. The ninth wiring line 210 may be disposed to partially overlap the normal source/drain contact 170 of the second standard cell 22.

According to some embodiments, each of the seventh wiring line 210 to the ninth wiring line 210 may be disposed not to overlap the upper part of the gate stack 120 of the first standard cell 20, the extended source/drain contact 170_1 of the second standard cell 22, and the normal source/drain contact 170 of the second standard cell 22, and may be disposed to entirely overlap them.

In FIG. 10, the integrated circuit according to some embodiments may further include a third wiring layer including a plurality of wiring lines extending in the X direction and parallel to the Y direction. The third wiring layer may include a tenth wiring line 310 and an eleventh wiring line 320.

The tenth wiring line 310 is connected to the eighth wiring line 220 through via 315, and may input an input signal. The tenth wiring line 310 may be disposed on the second wiring layer, while traversing the seventh wiring line 210, the eighth wiring line 220, and the ninth wiring line 210, which extend in the Y direction, in the X direction.

An eleventh wiring line 320 may electrically connect the seventh wiring line 210 and the ninth wiring line 210 through via 325, and may output an output signal. The eleventh wiring line 320 may be disposed on the second wiring layer, while traversing the seventh wiring line 210, the eighth wiring line 220, and the ninth wiring line 210, which extend in the Y direction, in the X direction.

According to some embodiments, each of the tenth wiring line 310 and the eleventh wiring line 320 may be disposed to partially or entirely overlap the upper part of the third wiring line 192 and the upper part of the fourth wiring line 192.

According to some embodiments, the first wiring line 191, the third wiring line 192, and the seventh wiring line 210 may be disposed to be parallel to the upper part of the first active region 112, the second active region 114 or the third active region 112. At this time, the second wiring line 193 and the eighth wiring line 220 may be disposed to be parallel to the upper part of the active region isolation film 105.

In the integrated circuit according to some embodiments, if a first power supply voltage is supplied to the source/drain contacts 170_1 (e.g., source contacts) of the first and third p-type transistors 134 of the first standard cell 20 and the source/drain contacts 170_1 (e.g., source contacts) of the second and fourth p-type transistors 134 of the second standard cell 22 through a plurality of wiring layers (e.g., the upper power rail 195_1), and a second power supply voltage is supplied to the source/drain contacts 170_1 (e.g., source contacts) of the first and third n-type transistors 138 of the first standard cell 20 and the source/drain contacts 170_1 (e.g., source contacts) of the second and fourth n-type transistors 138 of the second standard cell 22 through a plurality of wiring layers (e.g., the lower power rail 195_2), an output signal accompanying the first and second power supply voltages is output on the source/drain contacts 170 (e.g., drain contacts) of the first through fourth p-type and n-type transistors of each of the first and second standard cells 20 and 22 through the via 315 of the tenth wiring line 310. For example, the output signal depends on a voltage of the gate stack 120 applied through the second and fifth wiring lines 193. For example, the first power supply voltage is a high voltage (e.g., VCC, VDD, etc.) and the second power supply voltage is low voltage (e.g., VSS, GND, negative voltage, etc.).

In example embodiments, a source region of each of the first through fourth p-type transistors of the first standard cell 20 and a source region of each of the transistors of the second standard cell 22 are disposed independently for each transistor. Here, the expression "disposed independently" means that one independent source region is used for each transistor, and does not refer to a situation where one source region is shared by a plurality of transistors. For example, a source region of each of the transistors of the first standard cell 20 and respective source regions of the transistors of the second standard cell 22 are disposed to be separated from each other.

In other example embodiments, the source contacts of the transistors of the first standard cell 20 and the source contacts of the transistors of the second standard cell 22 are disposed independently for each transistor. Here, the expression "disposed independently" means that one source contact is used for each transistor, and does not mean that one source contact is shared by a plurality of transistors.

The second wiring layer disposed on the wiring line of the first wiring layer may output the output signal through the third wiring layer, on the basis of the signal to be output from the drain contacts of the transistors of the first standard cell 20 and the signals to be output from the drain contacts of the transistors of the second standard cell 22. By connecting the first standard cell 20 and the second standard cell 22 each including two or more p-type transistors and n-type transistors, the wiring lines of the first wiring layer having a relatively large resistance are used to be short, and an electrical connection loop is formed, using the wiring lines of the second wiring layer and the third wiring layer having lower resistance than the first wiring layers. Through such an electrical connection loop, the overall resistance can be reduced and the operating speed due to the RC delay can be improved, as compared to a case where one p-type transistor and one n-type transistor are included for each standard cell.

FIGS. 14 to 17 are diagrams for explaining the integrated circuit according to some embodiments. In the following description and drawings, repeated contents of parts explained in FIGS. 1 to 5, 6A, 6B, 7A, 7B, 8 to 10, 11A, 11B, 12, and 13 may be simplified or omitted.

Figure 14:
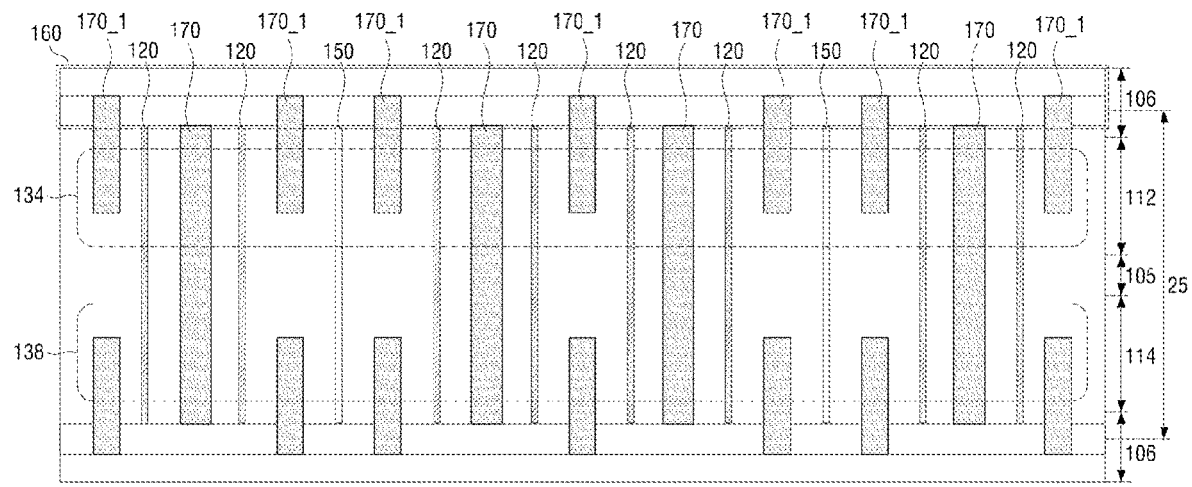
FIG. 14 is a top view of an integrated circuit showing up to front-end-of-line (FEOL) according to some embodiments.
Figure 15:
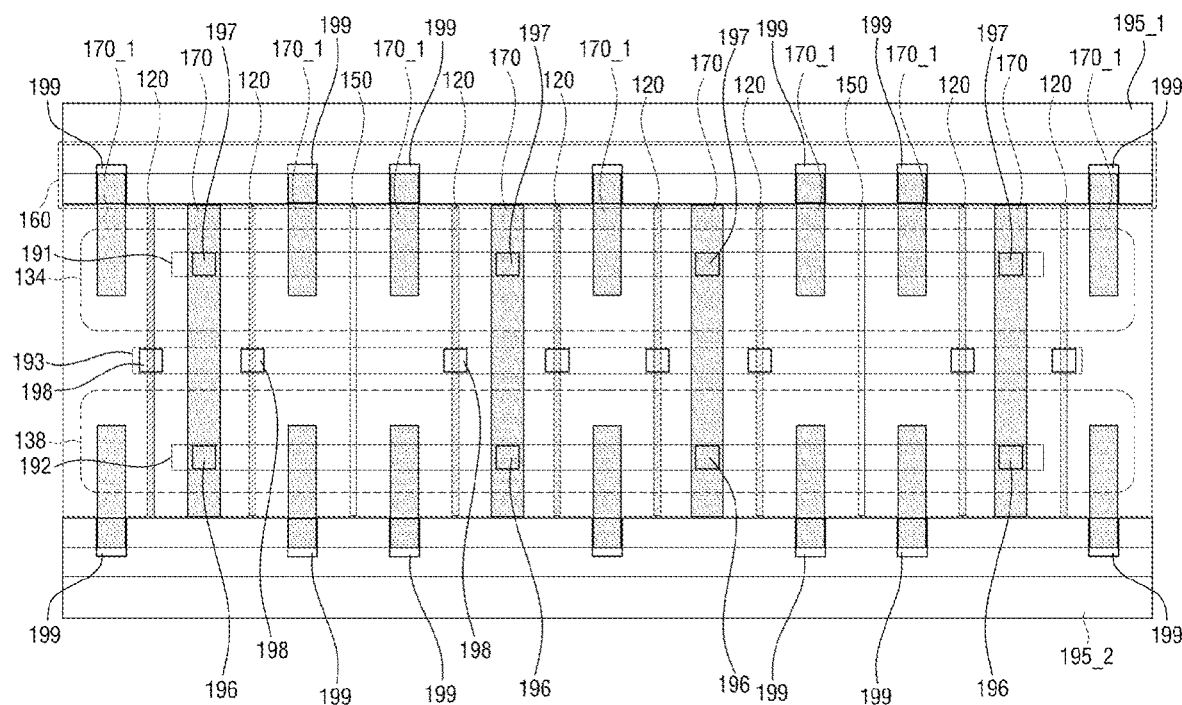
FIG. 15 is a top view of the integrated circuit showing up to a first wiring layer according to some embodiments.
Figure 16:
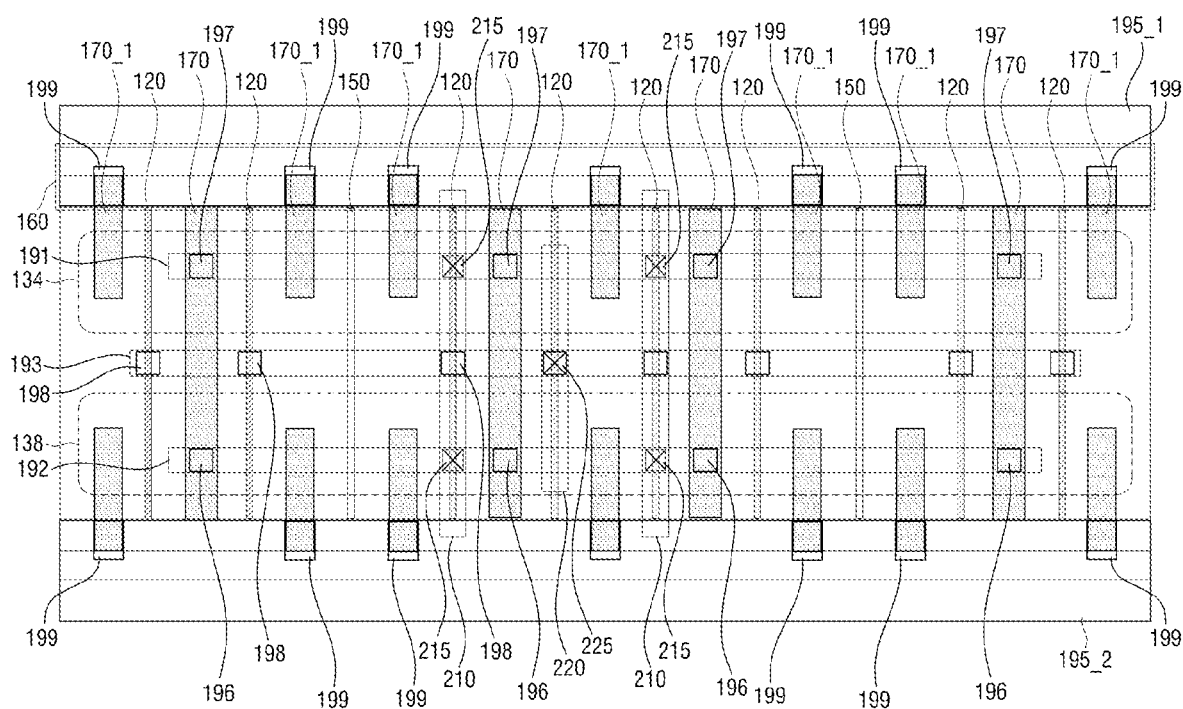
FIG. 16 is a top view of the integrated circuit showing a second wiring layer according to some embodiments.
Figure 17:
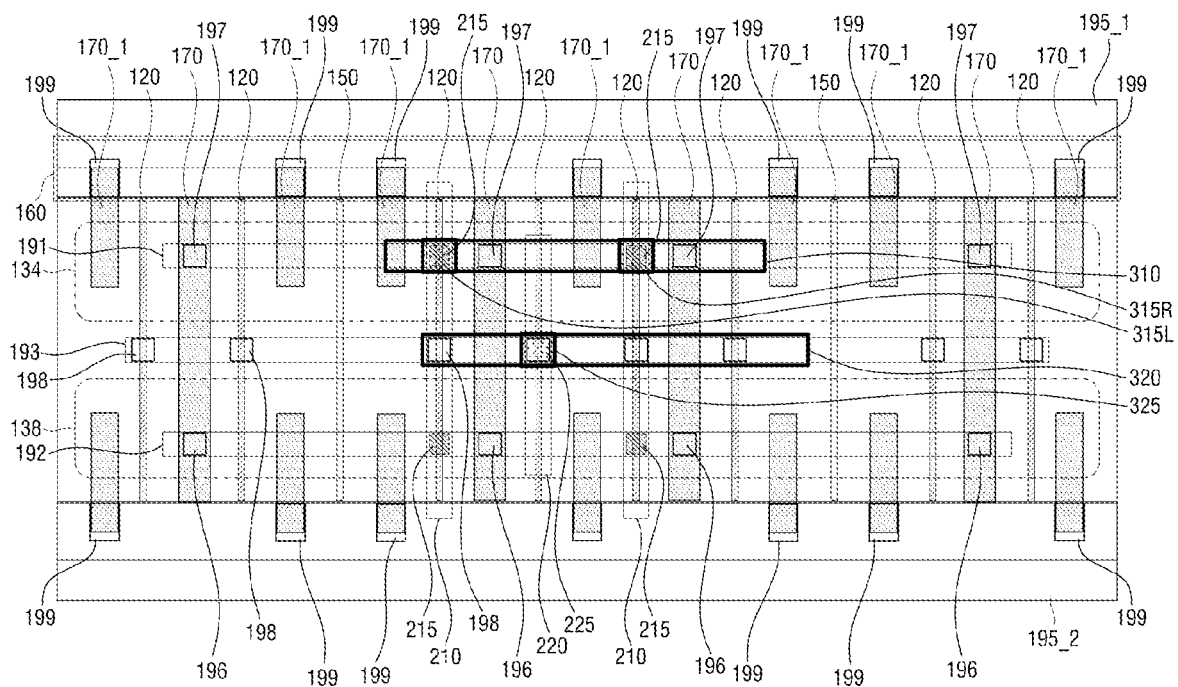
FIG. 17 is a top view of the integrated circuit showing a third wiring layer according to some embodiments.

FIG. 14 is a top view of an integrated circuit according to some embodiments, showing up to FEOL. FIG. 15 is a top view of the integrated circuit according to some embodiments showing up to the first wiring layer. FIG. 16 is a top view of the integrated circuit according to some embodiments showing a second wiring layer. FIG. 17 is a top view of the integrated circuit according to some embodiments showing a third wiring layer.

In FIGS. 14 to 17, the standard cell is divided with an insulating gate stack 150 as a boundary. In the embodiment of FIGS. 1 to 5, 6A, 6B, 7A, 7B, 8 to 10, 11A, 11B, 12, and 13, although each of the first standard cell 20 and the second standard cell 22 has a first height of 23 and a second height of 24 with two sets of four transistors connected in series, the standard cell of FIGS. 14 to 17 may have only a height of 25 with the two sets of two transistors connected in series.

In some embodiments, the standard cell may be formed on the substrate 100, extend along the X direction, and may include the first active region 112, the second active region 114 and the active region isolation film 105 which are defined by the deep trench DT.

According to the embodiment, the first active region 112 may be a region in which a p-type transistor is formed, and the second active region 114 may be a region in which an n-type transistor is formed. According to another embodiment, the first active region 112 may be a region in which an n-type transistor is formed, and the second active region 114 may be a region in which a p-type transistor is formed. The first active region 112 and the second active region 114 may include a well region doped with other types of impurities.

Since the first active region 112 and the second active region 114 are the same as those described in FIGS. 2 to 5, 6A, 6B, 7A, and 7B, description thereof may be omitted. The active region isolation film 105 and the cell isolation film 106 may include an insulating material which fills the deep trench DT defining the first active region 112 and the second active region 114. The cell isolation film 106 may be an insulating material film which is not disposed inside the cell, but extends along a cell boundary extending in the first direction X among the cell boundaries. For example, the cell isolation film 106 may be explained as being an insulating material film disposed along the cell boundary.

An integrated circuit according to some embodiments may include a plurality of gate stacks 120 and a plurality of insulating gates 150. The gate stack 120 and the insulating gate 150 may each extend along the Y direction. The gate stack 120 and the insulating gate 150 may be disposed to be adjacent and parallel in the X direction.

The gate stack 120 and the insulating gate 150, which are disposed to be adjacent to each other in the X direction, may be spaced apart from each other by 1CPP (contacted poly pitch). As an example, adjacent gate stacks 120 may be spaced apart from each other by 1CPP. As another example, the gate stack 120 and the insulating gate 150 adjacent to each other may be spaced apart from each other by 1CPP.

The insulating gate 150 may separate at least a part of the first active region 112 and at least a part of the second active region 114. The insulating gate 150 may separate the first upper active region 112U of the first active region 112.

The standard cell according to some embodiments of FIGS. 14 to 17 may have a width in the X direction of 5CPP, and a length thereof in the Y direction may be a length in the Y direction (e.g., referred to as a single height) of four sets of two transistors included in one standard cell. In contrast, the standard cell according to some of the embodiments of FIGS. 1 to 5, 6A, 6B, 7A, 7B, 8 to 10, 11A, 11B, 12, and 13 may have a width of 3CPP in the X direction, and a length thereof in the Y direction may be a length in the Y direction (e.g., referred to as double height) of two sets of four transistors included in one standard cell.

Referring to FIG. 14, the standard cell may include one first active region 112, an active region isolation film 105, and one second active region 114.

The normal source/drain contact 170 may be formed in at least a part of the semiconductor pattern 130. The extended source/drain contact 170_1 may be formed in at least a part of the semiconductor pattern 130. The normal source/drain contact 170 may generally overlap the first active region 112 or the second active region 114. A part of the extended source/drain contact 170_1 may extend onto the cell isolation film 106 and the cell gate cutting pattern 160. The extended source/drain contact 170_1 may be connected to the power rails (195_1 and 195_2 of FIG. 8) through the power rail via 199.

The normal source/drain contact 170 may be continuously arranged inside the standard cell in the Y direction. The extended source/drain contact 170_1 may be discontinuously arranged inside each standard cell in the Y direction.

In some embodiments, the standard cell may further include a plurality of wiring layers. Each wiring layer includes a plurality of wiring lines, and a portion having no wiring line may be filled with an interlayer insulating film 190.

In FIG. 15, a first wiring layer including a plurality of wiring lines is formed on the standard cell in the integrated circuit of FEOL. The first wiring layer may include a plurality of wiring lines extending in the X direction and parallel to the Y direction. The first wiring layer may include first to third wiring lines. The first to third wiring lines may be wiring lines 191, 193, and 192.

The first wiring line 191 is formed on the first active region 112, and is disposed across the gate stacks 120, the insulating gates 150, the semiconductor pattern 130 and associated source/drain contacts 170 to 170_1. The first wiring line 191 is electrically connected to the first active region 112 and the normal source/drain contact 170 through the via 197. For example, the first wiring line 191 is connected to the drain contact of the p-type transistor 134.

The second wiring line 193 is formed on the active region isolation film 105, and is disposed across the gate stacks 120, the insulating gates 150, and associated source/drain contacts 170. The second wiring line 193 is electrically connected to a gate contact 175 located on the active region isolation film 105 through the via 198. For example, the second wiring line 193 is connected to the gate contact 175 of the p-type transistor 134 and the n-type transistor 138.

The third wiring line 192 is formed on the second active region 114, and is disposed across the gate stacks 120, the insulating gates 150, the semiconductor pattern 130, and associated source/drain contacts 170 to 170_1. The third wiring line 192 is electrically connected to a normal source/drain contact 170 of the second active region 114 through the via 196. For example, the third wiring line 192 is connected to the drain contact of the n-type transistor 138.

Also, in some embodiments, the integrated circuit may include source/drain vias 196 and 197 which connect the first wiring layer and the source/drain contact 170, a gate via 198 which connects the first wiring layer and the gate contact 175, wiring patterns 191, 192 and 193 of the first wiring layer, power rails 195_1 and 195_2, and a power rail via 199 which connects the power rails 195_1 and 195_2 and the source/drain 170_1.

In FIG. 16, a second wiring layer including a plurality of wiring lines is formed on the first wiring layer in the integrated circuit. The second wiring layer may include a plurality of wiring lines extending in the Y direction and parallel to the X direction. The second wiring layer may include fourth to sixth wiring lines. The fourth to sixth wiring lines may be wiring lines 210, 220, and 210.

The fourth wiring line 210 is disposed on the gate stack 120 to at least partially overlap, and may be connected to each of the first wiring line 191 and the third wiring line 192 through a via 215.

The fifth wiring line 220 is disposed on the gate stack 120 to at least partially overlap, and may be connected to the second wiring line 193 through a via 225.

The sixth wiring line 210 is disposed on the gate stack 120 to at least partially overlap, and may be connected to the first wiring line 191 and the third wiring line 192 through the via 215.

In FIG. 17, a third wiring layer including a plurality of wiring lines is formed on the second wiring layer in the integrated circuit. The third wiring layer may include a plurality of wiring lines extending in the X direction and parallel to the Y direction. The third wiring layer may include seventh to eighth wiring lines. The seventh to eighth wiring lines may be wiring lines 310 and 320.

The seventh wiring line 310 is disposed on the first wiring line 191 to at least partially overlap, and may be connected to the fourth wiring line 210 and the sixth wiring line 210 through the via 215.

The eighth wiring line 320 is disposed on the second wiring line 193 to at least partially overlap, and may be connected to the fifth wiring line 220 through the via 225.

The source contacts of the transistors of the standard cells according to some embodiments are each disposed independently for each transistor. Here, the expression "disposed independently" means that one source contact is used for one transistor, and does not mean that one source contact is shared by a plurality of transistors.

In concluding the detailed description, those skilled in the art will appreciate that many variations and modifications may be made to the preferred embodiments without substantially departing from the principles of the present invention as defined by the appended claims. Therefore, the disclosed preferred embodiments of the invention are used in a generic and descriptive sense only and not for purposes of limitation.

What is claimed is:

1. An integrated circuit comprising:
 a first power rail and a second power rail disposed in parallel and spaced apart in a first direction; and
 a first standard cell, a second standard cell and a third standard cell,
 wherein the first to the third standard cells are disposed between the first power rail and the second power rail and disposed adjacent to each other in a second direction,
 wherein each of the first standard cell, the second standard cell and the third standard cell includes:
 a first-type active region extended in the second direction;

a second-type active region extended in the second direction and spaced apart from the first-type active region in the first direction;

first-type transistors disposed in the first-type active region; and second-type transistors disposed in the second-type active region, wherein first source contacts of the first-type transistors are independently connected to the first power rail and are separated from each other, wherein second source contacts of the second-type transistors are independently connected to the second power rail and are separated from each other, wherein the second standard cell includes drain contacts, and wherein one of drain contacts of the first-type transistors or one of drain contacts of the second-type transistors in the first standard cell is commonly connected to one of the drain contacts in the second standard cell through a via.

2. The integrated circuit of claim 1, wherein the first-type active region includes:

a first lower active region;

a first upper active region formed a fin shape protruding from the first lower active region; and at least two first-type nanosheets disposed to be spaced apart from the first upper active region and spaced apart from each other in a third direction, and wherein the second-type active region includes:

a second lower active region;

a second upper active region formed a fin shape protruding from the second lower active region; and at least two second-type nanosheets disposed to be spaced apart from the second upper active region and spaced apart from each other in the third direction.

3. The integrated circuit of claim 2, wherein each of the first lower active region and the second lower active region has side walls defined by deep trenches.

4. The integrated circuit of claim 1, wherein the first standard cell, the second standard cell and the third standard cell are divided by insulating gate stacks extending in the first direction.

5. The integrated circuit of claim 1, wherein at least one of the second-type transistors is formed at a position where a first gate stack and the second active region intersect, and wherein the first gate stack is included in the first standard cell.

6. The integrated circuit of claim 5, wherein the second standard cell further includes:

a first wiring layer having the first power rail, the second power rail and a first wiring pattern, disposed on a gate contact and extended in the second direction;

a second wiring layer having second wiring patterns disposed on the first wiring layer and extended in the first direction; and a third wiring layer having third wiring patterns disposed on the second wiring layer and extended in the second direction, and wherein one of the third wiring patterns connects between one second wiring pattern and other second wiring pattern and outputs an output signal.

7. The integrated circuit of claim 1, wherein the first power rail provides a high voltage and the second power rail provides a low voltage.

8. An integrated circuit comprising:

a first wiring line which is electrically connected to a drain contact of a first p-type transistor in a first standard cell and a drain contact of a second p-type transistor in a second standard cell;

a second wiring line which is electrically connected to gate contacts of the first and second p-type transistors, a first n-type transistor in the first standard cell and a second n-type transistor in the second standard cell; and a third wiring line which is electrically connected to a drain contact of the first n-type transistor and a drain contact of the second n-type transistor, wherein the first wiring line, the second wiring line and the third wiring line are disposed in a first wiring layer and extended in a first direction, and wherein the drain contact of the first p-type transistor and the drain contact of the first n-type transistor are arranged as a continuous structure extending in a second direction.

9. The integrated circuit of claim 8, further comprising:

a first power rail and a second power rail disposed in parallel and spaced apart in the second direction, wherein a source contact of the first p-type transistor and a source contact of the second p-type transistor are electrically connected through the first power rail.

10. The integrated circuit of claim 9, wherein the second standard cell disposed to be adjacent to the first standard cell in the first direction, and wherein the first standard cell and the second standard cell are disposed between the first and second power rails.

11. The integrated circuit of claim 10, further comprising:

a fourth wiring line which is electrically connected to the first wiring line and the third wiring line;

a fifth wiring line which is electrically connected to the second wiring line; and a sixth wiring line which is electrically connected to the first wiring line and the third wiring line, wherein the fourth, fifth and sixth wiring lines are disposed in a second wiring layer stacked on the first wiring layer and extended in the second direction.

12. The integrated circuit of claim 11, further comprising:

a seventh wiring line which is electrically connected to the fourth wiring line and the sixth wiring line and provides an input signal; and an eighth wiring line which is electrically connected to the fifth wiring line and outputs an output signal, wherein the seventh and eighth wiring lines are disposed in a third wiring layer stacked on the second wiring layer and extended in the first direction.

* * * * *